(12) United States Patent
Weick et al.

(10) Patent No.: US 8,591,105 B2
(45) Date of Patent: Nov. 26, 2013

(54) OPTICAL GUIDE WITH TEMPERATURE SENSING MATRIX

(75) Inventors: Jürgen-Michael Weick, Asperg (DE); Armin Horn, Renningen (DE); Gerhard Hammann, Korntal-Muechingen (DE); Peter Laitenberger, Cambridge (GB); Nick Collier, Burwell (GB); Ross Peter Jones, Cambridge (GB)

(73) Assignee: TRUMPF Werkzeugmaschinen GmbH + Co. KG, Ditzingen (DE)

( * ) Notice: Subject to any disclaimer, the term of this patent is extended or adjusted under 35 U.S.C. 154(b) by 1121 days.

(21) Appl. No.: 11/910,120

(22) PCT Filed: Apr. 3, 2006

(86) PCT No.: PCT/EP2006/003019
§ 371 (c)(1),
(2), (4) Date: Jul. 12, 2010

(87) PCT Pub. No.: WO2006/103104
PCT Pub. Date: Oct. 5, 2006

(65) Prior Publication Data
US 2010/0296546 A1  Nov. 25, 2010

(30) Foreign Application Priority Data
Apr. 1, 2005 (EP) .................................. 05007148

(51) Int. Cl.
*G01K 7/01* (2006.01)
*G01J 5/08* (2006.01)
*G01J 5/10* (2006.01)
*G02B 6/02* (2006.01)
*H01L 27/00* (2006.01)

(52) U.S. Cl.
USPC ........... 374/178; 374/121; 374/131; 374/141; 374/161; 250/338.4; 385/12; 359/34; 430/945; 372/6

(58) Field of Classification Search
USPC ......... 374/120–121, 129, 130–132, 161, 141, 374/170, 178, 179, 124, 166, 167, 100, 29, 374/30; 250/338.1, 227.11, 338.3, 338.4, 250/339.02, 339.04, 472.1, 339.06, 208.01, 250/493.1, 491.1, 492.2, 492.1, 216; 257/432, 433, 290, 292, 431; 359/883, 359/848, 34; 385/12, 133, 129, 131, 132; 356/432; 372/6; 430/945
See application file for complete search history.

(56) References Cited

U.S. PATENT DOCUMENTS 5,054,936 A * 10/1991 Fraden .......................... 374/164
5,311,020 A * 5/1994 Silver et al. ................. 250/338.4
(Continued)

FOREIGN PATENT DOCUMENTS

JP         60015528 A    1/1985
WO      WO 99/39394     8/1999

OTHER PUBLICATIONS

Translation of International Preliminary Report on Patentability from corresponding PCT Application No. PCT/EP2006/003019, mailed Feb. 1, 2008, 5 pages.

(Continued)

*Primary Examiner* — Gail Verbitsky
(74) *Attorney, Agent, or Firm* — Fish & Richardson P.C.

(57) ABSTRACT

The invention relates to an optical element for guiding and forming a laser beam, and to a method for recording beam parameters, particularly in a laser system, comprising a carrier substrate (40) and a coating (39), which is applied to at least one side of the carrier substrate (40), and comprising at least one temperature sensor (38). The temperature sensor (38) is comprised of a number of pixels arranged in a matrix, and each respective pixel has at least one temperature-sensitive element (39). The at least one temperature-sensitive element (39) of the pixel is constructed inside the carrier substrate (40) made of silicon.

26 Claims, 3 Drawing Sheets

(56) References Cited

U.S. PATENT DOCUMENTS

| | | | | |
|---|---|---|---|---|
| 5,367,167 A | * | 11/1994 | Keenan | 250/338.4 |
| 5,689,087 A | * | 11/1997 | Jack | 136/213 |
| 6,031,231 A | * | 2/2000 | Kimata et al. | 250/332 |
| 6,031,248 A | | 2/2000 | Mei et al. | |
| 6,140,646 A | * | 10/2000 | Busta et al. | 250/332 |
| 6,246,097 B1 | * | 6/2001 | Kato et al. | 257/432 |
| 6,495,829 B1 | * | 12/2002 | Oda | 250/339.02 |
| 6,541,298 B2 | * | 4/2003 | Iida et al. | 438/54 |
| 6,677,654 B2 | * | 1/2004 | Kim et al. | 257/414 |
| 7,045,785 B2 | * | 5/2006 | Iida et al. | 250/338.1 |
| 7,060,602 B2 | * | 6/2006 | Saito | 438/612 |
| 7,193,202 B2 | * | 3/2007 | Stiens et al. | 250/214.1 |
| 7,495,220 B2 | * | 2/2009 | Blackwell et al. | 250/338.1 |
| 8,237,237 B2 | * | 8/2012 | Wano et al. | 257/432 |
| 8,384,809 B2 | * | 2/2013 | Miyata | 348/294 |
| 2002/0021450 A1 | | 2/2002 | Aoki | |
| 2002/0039838 A1 | * | 4/2002 | Iida et al. | 438/689 |
| 2002/0110180 A1 | | 8/2002 | Barney et al. | |
| 2003/0090256 A1 | | 5/2003 | Kircher | |
| 2003/0133489 A1 | * | 7/2003 | Hirota et al. | 374/121 |
| 2004/0140428 A1 | * | 7/2004 | Ionescu et al. | 250/338.1 |
| 2004/0164372 A1 | * | 8/2004 | Akram et al. | 257/467 |
| 2004/0169144 A1 | * | 9/2004 | Shibayama | 250/338.1 |
| 2005/0274896 A1 | * | 12/2005 | Kawano et al. | 250/370.14 |
| 2006/0091284 A1 | * | 5/2006 | Viens et al. | 250/201.9 |
| 2006/0124831 A1 | * | 6/2006 | Schimert et al. | 250/214 R |
| 2007/0120058 A1 | * | 5/2007 | Blackwell et al. | 250/338.1 |
| 2010/0091292 A1 | * | 4/2010 | Pfaff | 356/457 |

OTHER PUBLICATIONS

International Search Report from corresponding PCT application No. PCT/EP2006/003019, mailed Aug. 4, 2006.

* cited by examiner

OPTICAL GUIDE WITH TEMPERATURE SENSING MATRIX

TECHNICAL FIELD

The invention relates to an optical element and method for guiding and shaping a laser beam, and to a method for recording beam parameters with such an optical element.

BACKGROUND

The use of laser beams for machining materials is widespread in industrial manufacturing. For monitoring the machining and for quality assurance, a constant power of an electromagnetic radiation is generated by a laser arrangement and is output with constant parameters. A laser arrangement is provided with a plurality of optical elements that guide and shape the beam. At the same time, the power of the beam is also influenced thereby. The quality of the laser arrangement is essentially determined by the beam orientation, the beam profiling, and the beam power. These parameters can be optimized for the machining processes and can be adversely influenced by aging, incipient destruction, and/or contamination of the optical elements. Such influences in turn adversely affect the beam parameters of the electromagnetic radiation or of the laser beam. In order to record or monitor the parameters, there is the possibility of producing a so-called mode shot of a laser beam. The laser beam generated by the laser arrangement is coupled out from the customary beam path and directed onto a plexiglass cube, where material vaporizes upon impingement of the laser beam and the remaining contour enables a statement about the quality of the beam. This technique is time-consuming and requires an interruption of production.

A brochure from the company Prometec entitled "Laserscope UFC60" discloses a device that enables a continuous measurement and monitoring of unfocused laser radiation from lasers with high power that is principally used in laser machining. The device operates according to the measurement principle according to which a wire increases its electrical resistance if its temperature increases on account of absorbed radiation. In order to determine measurement data, a plurality of grids arranged one above another with extremely thin wires arranged next to one another are provided. An apparatus with two grids mounted one above another is proposed for beam monitoring, wherein this device receiving the grids is to be positioned in a beam path in such a way that the laser beam passes through said grids.

It is difficult to use this device in routine operation of a laser arrangement because a housing receives the grids. As a result, no online measurements can be carried out. Furthermore, the wires provided for recording information can be sensitive since they have a diameter in the lower micrometers range and can break very easily. In particular, a cooling of the grids for an exact measurement is possible with some difficulty since the wires break more easily when there is a strong air flow. Without cooling of the grids, however, the recorded values can be beset with errors as a result of continuous heating of the grids. Furthermore, dirt particles can deposit on the grid and additionally corrupt the measurement results. Moreover, the device cannot be used within a laser apparatus, a beam source, or a beam generator. The contamination, aging, and beginning of the destruction of optical elements cannot be recorded either.

FR 2 698 495 A1 reveals a method for measuring a temperature of a lens provided in a laser arrangement. A first thermoelement fitted at the edge of the lens is provided for recording the temperature of the lens. A further temperature element is arranged on a front side of an exit of the lens outside the beam path. A third thermoelement is fitted at a shoulder of the receptacle. These three thermoelements are respectively arranged in a manner offset by 120° relative to one another and forward the recorded temperature to an evaluation unit. As soon as the recorded temperature has exceeded a threshold value, an alarm signal is output.

By virtue of the arrangement of the thermoelements on the lens and the lens receptacle, individual measurements at the respective contact locations of the thermoelements relative to the lens are carried out by the thermoelements. This does not enable a statement about the determination of the degree of contamination or an incipient destruction or aging and the power of the beam or further beam parameters.

U.S. Pat. No. 4,692,623 discloses a device for recording a situation and a position of a laser beam. The device has a grid of conductor tracks on a glass substrate, the conductor tracks being insulated from one another at the crossover points. The conductor tracks can be covered with a reflective coating. A detector and a display device for recording the change in the electrical resistance on account of the absorbed heat are connected to the conductor tracks.

An analogous arrangement is disclosed in CH 690 796 A5. The mirror disclosed in this document differs from the previous device by virtue of the fact that the grid of conductor tracks is formed in two planes isolated by an insulation. A first layer of a multiplicity of conductor tracks arranged parallel to one another is provided on an insulation on the carrier material of the mirror. The layer is covered with an insulation that, in turn, receives a second layer of conductor tracks running parallel to one another. The second layer of conductor tracks is oriented in a manner rotated by 90° relative to the first layer. The second layer of conductor tracks is also covered by an insulation. Contact areas for connection to an evaluation unit are provided in each case at the outer ends of the conductor tracks.

EP 1 310 782 A1 has disclosed an optical element having a coating on a carrier material. Such optical elements are used for guiding and shaping a laser beam. For recording a situation and a position of a laser beam, it is provided that the optical element has a grid structure composed of thin conductive material on or in the coating or the carrier material. Via contact elements acting on the optical element, the recorded measured values can be forwarded into a measuring device or evaluation unit.

What the three abovementioned devices (found in U.S. Pat. No. 4,692,623, CH 690 796 A5, and EP 1 310 782 A1) all have in common is that a temperature change is brought about in the carrier materials on account of the absorbed radiation, which temperature change is in turn transmitted to the conductor tracks in order to record a change in the electrical resistance in the conductor tracks. However, the temperature change is recorded integrally by means of the respective conductor track, or the length thereof between the two end points. As a result, an evaluation with respect to the beam position and beam size is effected approximately. An evaluation of an intensity distribution of the beam, as is made visible by a mode shot, may not be possible.

SUMMARY

An optical element is used for guiding and shaping a laser beam, such optical element enabling a precise recording of the beam position, the beam diameter, and the intensity distribution of the beam while maintaining the beam guiding properties of an electromagnetic beam.

The optical element described herein has the advantage that an exact or more precise evaluation of the beam parameters, such as, for example, the beam position, the beam diameter, and the intensity distribution of the beam, is made possible. The configuration of the temperature sensor as a matrix composed of a multiplicity of pixels enables a spatial resolution of the intensity for the laser beam impinging on the optical element. On account of such a spatial resolution of the intensity, it is possible to record a beam alteration during the operation of a laser system without the laser beam being coupled out. The beam alteration represents an image about the state of the laser, with the result that not only optical elements but also further components of the laser systems can be monitored. The so-called mode shot can be replaced by the configuration of the optical element according to the invention. It is no longer necessary to couple out the laser beam in order to generate a mode shot. The measured values recorded by the temperature sensor furthermore enable an evaluation of a thermal loading of the optical element and also about the state of the optical element with regard to aging and contamination or incipient destruction. At the same time, the use of at least one optical element according to the invention can afford a permanent monitoring of the laser system without intervention in routine production.

According to one implementation, it is provided that the optical element includes a matrix of temperature-sensitive elements on a carrier material. By virtue of the arrangement of the temperature-sensitive elements in a matrix as a temperature sensor, a statement can simultaneously be made about further beam parameters such as, for example, the position of the impingement area and the size or the diameter of the electromagnetic beam, the local resolution of the intensity distribution, the absolute beam power, and the temporal resolution capability. The recording of the position makes it possible to record the beam orientation or the beam course with respect to the optical element and, consequently, misalignments possibly present. The recording of the beam diameter and/or the temperature profile makes it possible to determine the present power in comparison with the known desired power of the beam.

According to a further advantageous configuration of the method, it is provided that the at least one temperature-sensitive element is constructed in a silicon wafer, for example, as a diode. When the semiconductor material is used as a carrier substrate, it is possible, for example, to implement the diodes as temperature-sensitive elements directly into the carrier substrate. CMOS processes can be used to produce the diodes. Further known production processes can likewise be used.

The temperature-sensitive elements can be embedded in P- or N-doped depressions or wells ("p-wells" or "n-wells"). This provides an electrical insulation between the individual diodes, thereby reducing or preventing a crosstalk between the different temperature-sensitive elements.

Preferably, the temperature-sensitive elements are thermally insulated from one another. For this purpose, for example, trenches are provided in the carrier substrate, for example, the silicon wafer, in order to insulate the temperature-sensitive elements from one another. The trenches are filled with an insulating layer and are referred to as "deep-trench isolation". The recording and localizing of the electromagnetic beam impinging on the optical element can thereby be localized. At the same time, an improved temperature recording can thereby be made possible for each temperature-sensitive element, whereby the beam profiling can be recorded more precisely.

In one implementation, a plurality of temperature-sensitive elements are connected in series in a pixel. It is thereby possible to measure one or a plurality of time-dependent features or characteristic curves within the sensor chain, such as, for example, a voltage drop in the case of a specific current or a specific current drop in the case of a known voltage. By virtue of the fact that a pixel of the matrix includes a plurality of temperature-sensitive elements, the measurement accuracy of a pixel and hence the performance of the temperature sensor including a plurality of pixels can be increased. As an alternative, it can be provided that the temperature-sensitive elements of a pixel are connected in parallel, whereby an averaged statement about a temperature of the pixel is likewise made possible.

Another implementation provides for a coating to be provided at a side of the carrier substrate that faces the temperature sensor, and a carrier material to be provided at a side of the carrier substrate that is remote from the temperature sensor. This construction enables, for example, very thin silicon wafers to be usable for the implementation of the diodes for producing the pixels as a matrix for forming a temperature sensor. Moreover, a multiplicity of carrier materials can be applied that have a high thermal conductivity and/or mechanical stiffness in order to receive the carrier substrate. By way of example, an adhesive-bonding connection can be provided between the carrier substrate and the carrier material. Such carrier materials can be provided from metal, for example, copper, or from other materials such as for example, silicon.

An alternative implementation of the optical element provides for a carrier material to be provided at a side of the carrier substrate that is remote from the temperature sensor, and a coating to be applied at the opposite side of the carrier material. This construction makes it possible, e.g., for an increased reflection or reduced transmission of the laser beam to be provided depending on the carrier material, such that the carrier material acts as a filter, a sufficient radiation energy still acting on the temperature sensor.

In the case of the last-mentioned implementation, the carrier material can be formed in highly transmissive or fully transmissive fashion. By way of example, the carrier material has a transmittance of at least 97%.

A passivation layer can be provided between a coating and the carrier substrate in order to separate the highly reflective coating from the connections of the temperature sensor and also the temperature-sensitive elements. This arrangement is provided in a first implementation of a layer construction for the optical element. In the second alternative implementation, the temperature sensor is assigned in a manner remote with respect to the incident laser beam in the beam path and receives an absorber layer on its rear side.

According to another configuration, a stress-compensating layer can be applied on a rear side of the carrier material, opposite to the coating, where the stress-compensating layer can include a silicon nitride or similar materials. Such a layer can be applied, for example, by plasma-enhanced or chemical vapor deposition methods.

According to another configuration, the coating of the optical element can have a reflectance of the laser radiation of at least 98%. As a result, on the one hand, the imaging properties, for example, the guiding and/or shaping of the laser beam, are preserved and, on the other hand, the temperature sensor is protected from the intensity of the incident laser beam. The coating has the effect that the laser beam acts on the temperature sensor in attenuated fashion and therefore has a filter function. The non-reflected radiation or the waste heat thereof is used for the measurement.

Furthermore, at least one multiplexer and electronic components for the temperature sensor can be constructed or embedded adjacent to the matrix including pixels in the carrier substrate. As a result, it is possible to provide a fully integrated configuration of a temperature sensor in which both the temperature-sensitive elements and the associated circuit and signal conversion are effected in the optical element, thereby enabling a signal to be output in a simple manner.

A method is described for recording beam parameters in which one or a plurality of optical elements in accordance with one of the preceding implementations are interrogated in a beam path of an electromagnetic beam and the recorded signals are recorded in an evaluation unit. In the evaluation unit, the data of the individual pixels are taken up and evaluated, thereby enabling a determination of the beam position, of the beam diameter, and of the intensity distribution. Even with a single optical element arranged in the beam path, it is possible to record the information important for monitoring purposes, such as the beam position, the beam diameter, and the intensity distribution of the beam. In the case of monitoring carried out over a longer time duration, an alteration of the beam parameters can simultaneously be effected by means of a comparison with different time intervals. If a plurality of optical elements are provided in a beam path of a laser system, the recorded beam parameters at each individual optical element can be compared with one another, whereby, for example, an alteration of the beam profile along the beam path and also an alteration of the beam position and a decrease of a beam power can be recorded. As a result, it is also possible simultaneously to draw conclusions about incipient destruction, aging and contamination of the optical element or optical elements. In addition, the evaluation unit can enable independent readjustment of parameters in the laser arrangement in order to optimize or adjust the beam parameters.

The data recorded by the optical elements can be provided by the evaluation unit for remote interrogation via a remote data transmission unit. This enables a remote diagnosis or a teleservice and a remote servicing. A plurality of laser systems can be monitored in a central recording location. In the event of deviations of the desired values determined for optimum operation, the recording location, which is established in a manner spatially separated from the laser systems, can access the respective laser system in order to set the laser system to the optimum parameters.

The invention and also further advantageous embodiments and developments thereof are described and explained in more detail below on the basis of the examples illustrated in the drawings. The features that can be inferred from the description and the drawings can be applied individually by themselves or as a plurality in any desired combination according to the invention.

DETAILED DESCRIPTION

Figure 1:
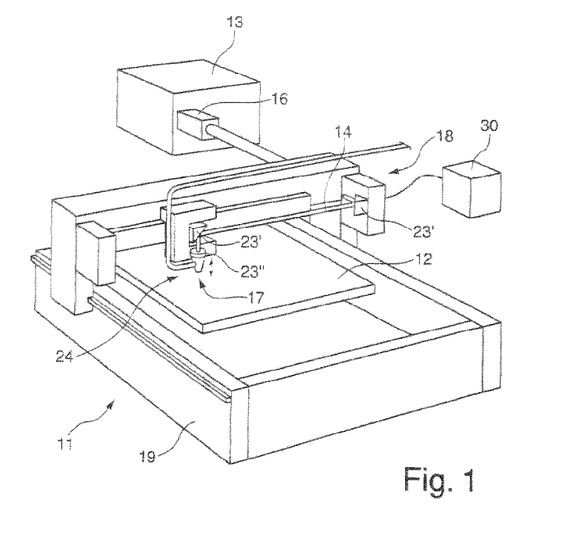
FIG. 1 is a perspective view of a laser machining machine.

FIG. 1 illustrates a laser system 11 that can be used for the machining of materials and workpieces 12. The laser system 11 includes a laser arrangement with a laser apparatus 13 that generates an electromagnetic radiation, for example, a laser beam 14. The laser apparatus 13 can be a $CO_2$ laser. The wavelength of the laser beam 14 preferably lies in the far infrared range.

A beam telescope 16 is provided at the laser apparatus 13, via which beam telescope the laser beam 14 generated in the laser apparatus 13 is coupled out. From the beam telescope 16 as far as the machining location 17, the laser beam 14 is guided by an external optical unit 18. The external optical unit 18 is provided on a basic machine frame 19 embodied in single- or multi-axis fashion depending on the instances of use. In the present exemplary embodiment, the external optical unit 18 is moved in an X, Y and Z direction. A single- or multi-axis optical unit is also referred to as a floating optical unit. As an alternative, the workpiece 12 and/or the optical unit 18 can also be moved.

Figure 2:
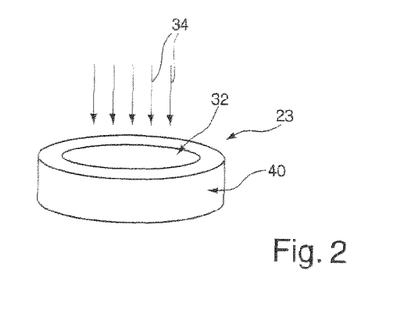
FIG. 2 is a perspective view of an optical element that can be used in the laser machining machine of FIG. 1.

The laser system 11 has a multiplicity of optical elements 23 in accordance with FIG. 2. The optical elements 23 used in the laser apparatus 13 are also referred to as internal optical elements and include, for example, rear mirrors, coupling-out mirrors, deflection mirrors, partly transmissive mirrors, and partly transmissive optical units, such as lenses, which are not illustrated. The external optical unit has at least one first deflection mirror 23' for beam guiding and beam shaping and, in the machining head 24, at least one further deflection mirror 23' and a focusing optical unit 23", which is formed as a lens, for example. A concave mirror can also be provided instead of the further deflection mirror 23' and the focusing optical unit 23". The beam path of the laser beam 14 from the beam telescope 16 as far as the focusing optical unit 23" is closed by a bellows (not shown).

The optical element 23 in accordance with FIG. 2 includes a carrier substrate 40 composed of metallic material, an alloy, or a semiconductor material. A coating 32 is provided on the carrier substrate 40. Said coating 32 can include different metals or metal alloys and semiconductor materials. The set of arrows 34 is representative of the laser beam 14.

Figure 3:
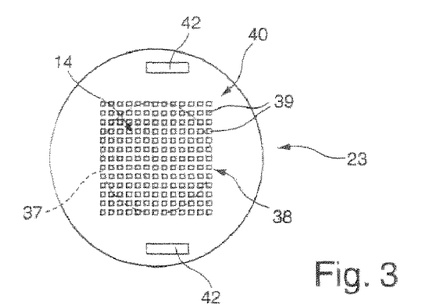
FIG. 3 is a schematic plan view of a temperature sensor provided in an optical element without a coating.

An optical element 23 in accordance with FIG. 2 (shown without the coating 32) is illustrated in plan view in FIG. 3. A temperature sensor 38 is provided or embedded in the carrier substrate 40. Said temperature sensor 38 includes a plurality of pixels 36 that are arranged in a matrix and that in each case include at least one temperature-sensitive element 39. By way of example, an arrangement is provided in which a plurality of temperature-sensitive elements 39 are arranged in a plurality of rows and columns alongside one another at predetermined spacings with respect to one another.

The temperature-sensitive elements 39 can be embodied in the form of diodes that are connected to one another in a matrix, for example, in rows and columns, in order to output a received signal via symbolically illustrated connections 42 to an evaluation unit 30 (shown in FIG. 1) in the laser system 11. Such connections 42 can be formed for example by vapor deposition, as matrices, by coating or implantation of connection pieces. Wires or other connecting pieces can furthermore be used. The temperature sensor 38 can additionally include electronic circuits, such as multiplexers or amplifiers, for example, which enable, simplify, or improve the signal pick-up. These can be embedded in the carrier substrate 40. The circle 37 illustrated in FIG. 3 symbolizes the impinging laser beam 14.

Figure 4:
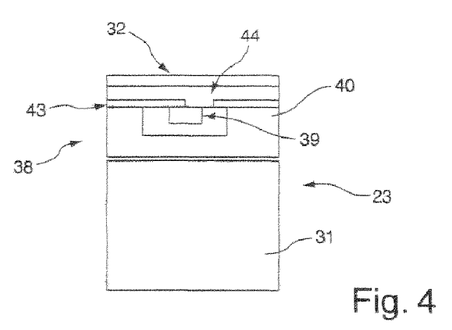
FIG. 4 is a schematic sectional illustration of a temperature-sensitive element of a temperature sensor in an optical element.

FIG. 4 shows a schematic sectional illustration of a first embodiment of a construction of an optical element 23 with a temperature-sensitive element 39 integrated in the carrier substrate 40, where the temperature sensitive element 39 is part of a temperature sensor 38. The temperature-sensitive element 39 can be formed as a diode, for example, and the carrier substrate 40 can be formed as a layer including silicon or as a silicon wafer, and the diode can be introduced in the silicon layer or into the silicon wafer by means of a CMOS-compatible process. The temperature-sensitive element 39 is connected via connecting lines 43 to further temperature-sensitive elements 39 in a matrix in the form of rows and columns (such as the matrix shown in FIG. 3). A passivation layer 44 is preferably applied on the temperature-sensitive elements 39 in order to reduce or prevent a crosstalk. The coating 32 is applied to the passivation layer 44.

In this embodiment, the silicon wafer or the carrier substrate 40 is made very thin and applied on a layer of a carrier material 31. Carrier materials 31 composed of metal such as, for example, copper and silicon can be provided for receiving the carrier substrate 40. This configuration has the advantage that different carrier materials can be selected for different instances of use and can be combined with the carrier substrate 40 in order, for example, to select a thermal conductivity or mechanical strength adapted to the application.

An alternative embodiment of FIG. 3 provides for the carrier substrate 40 to have a thicker layer composed of silicon, such that the additional use of a carrier material 31 is not required.

Figure 5:
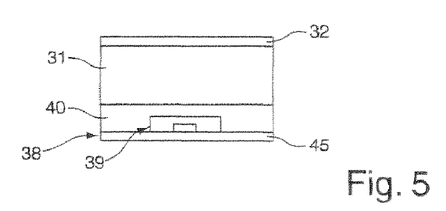
FIG. 5 is a schematic sectional illustration of a temperature-sensitive element of a temperature sensor in an optical element with an alternative construction.

FIG. 5 illustrates an alternative embodiment of an optical element 23. This embodiment has a construction in which a coating 32 is applied on the carrier material 31. The carrier substrate 40 is applied on the opposite side of the carrier material 31 to the coating 32, the temperature sensor 38 pointing toward the rear side of the optical element 23. The temperature sensor 38 is covered by an absorption layer 45. In this embodiment, the carrier material 31 is formed in highly or fully transmissive fashion. By way of example, materials such as, for example, ZnSe can be used. These materials have a transmittance of at least 97%. The coating 32 is preferably provided with a transmissivity of less than 2%.

The coating 32 on the carrier substrate 40 or the carrier material 31 covers the temperature sensor 39 over the whole area and can extend over the whole area over the entire surface of the carrier substrate 40 and the carrier material 31 with the exception of the connections 42 for fitting contact elements. The coating 32 has a dual function in order to enable the laser beam to be guided and/or shaped and also to ensure an attenuation of the laser beam for the temperature-sensitive elements 39 for the protection thereof and for measured value recording.

Figure 6:
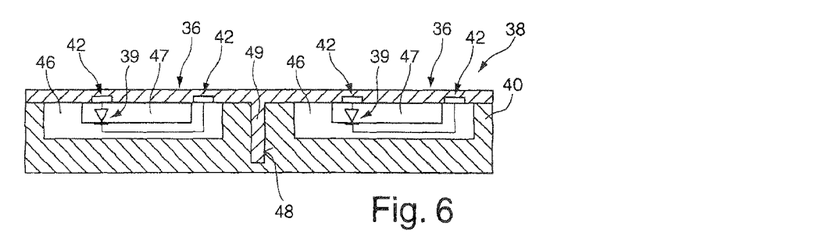
FIG. 6 is a schematically enlarged sectional illustration of temperature-sensitive elements arranged in the carrier substrate.

FIG. 6 illustrates a schematic enlarged sectional illustration of two pixels 36—arranged alongside one another—of the temperature sensor 38 in the optical element 23 in accordance with FIG. 3. Each pixel 36 includes a diode as a temperature-sensitive element 39 in a p- or n-doped well 46 with an oppositely doped diffusion layer 47 in the silicon wafer (that is, the carrier substrate 40). A CMOS process can advantageously be used for this purpose. The p- or n-doped wells 46 bring about an electrical insulation between the two adjacent temperature-sensitive elements 39 and enable a reduction of the crosstalk behavior between the temperature-sensitive elements 39. Structures such as trenches 48, for example, can additionally be introduced into the optical element 23, and these structures increase the thermal insulation between the temperature-sensitive elements 39 arranged in a matrix in order to form a temperature sensor 38. The trenches 48 are closed with a thermally insulating layer 49. For this purpose, separating cuts or etchings are introduced into the surface of the wafer (that is, the carrier substrate 40), and are subsequently filled with an insulating material to form the thermally insulating layer 49. This considerably reduces the thermal crosstalk.

In order to increase the planarity of the silicon wafers (that is, the carrier substrates 40), a stress-compensating layer can be applied on the rear side of the silicon wafer. The stress-compensating layer can be provided, for example, from SiRN (silicon-rich nitride), silicon nitride, or similar materials. The stress-compensating layer is applied by means of a plasma enhanced vapor deposition method (PECVD) or a low pressure vapor deposition method (LPCVD).

In order to reduce the surface roughness of the silicon wafer (that is, the carrier substrate 40) and therefore in order to increase the reflective properties, the surface of the carrier substrate 40 in which the temperature sensor 38 is provided or embedded is polished. Reflective layers, for example, gold layers and/or dielectric layers, can additionally be applied.

Figure 7:
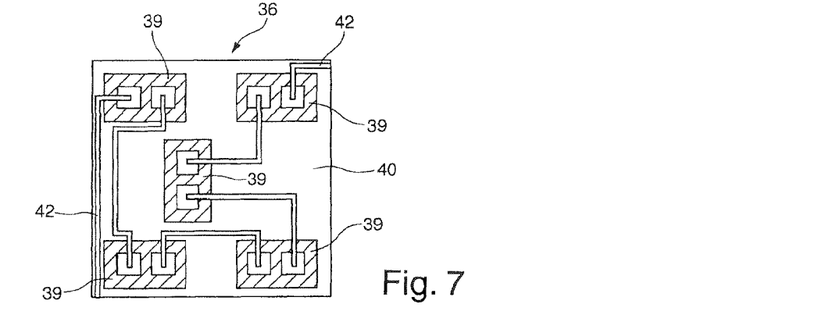
FIG. 7 is a schematic illustration of a pixel of a temperature sensor, which includes a matrix of temperature-sensitive elements.

FIG. 7 illustrates a pixel 36 of a temperature sensor 38 in enlarged fashion. In this exemplary embodiment, by way of example, five temperature-sensitive elements 39 are connected in series with one another and form the pixel 36. This arrangement has the advantage that a plurality of temperature-dependent features or characteristic curves can be recorded, whereby the measurement accuracy of each pixel 36 is increased. As an alternative, it can be provided that the temperature-sensitive elements 39 are arranged in a parallel connection with respect to one another.

Figure 8:
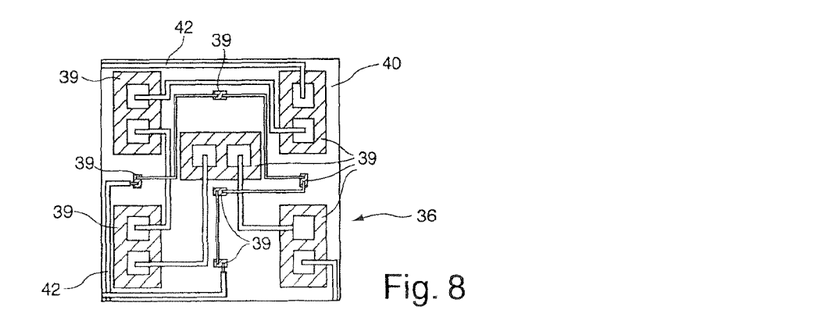
FIG. 8 is a schematic illustration of a pixel of a temperature sensor with two matrices of temperature-sensitive elements.

An alternative configuration of a pixel 36 for a temperature sensor 38 is illustrated in FIG. 8. In this exemplary embodiment, two series of temperature-sensitive elements 39 are provided in a pixel 36. These can again be connected in series or else in parallel with one another in accordance with the exemplary embodiment. A plurality of signals can thereby be recorded, a higher-quality statement about the value recorded on average being made possible for an event.

The optical elements 23 are arranged in holders or receptacles of the laser system 11. These receptacles or holding elements can have contact elements that act on the connections 42 when the optical elements 23 are inserted into the holding devices, such that a contact-connection is effected. As an alternative, it can be provided that other contacts are bonded or adhesively bonded prior to the insertion on the optical elements 23 or are formed as plug connections, in order to read out the recorded measured values from the optical element 23 and forward them to the evaluation unit 30. Furthermore, it can be provided that a contactless transmission of the measurement data from the optical element 23 to the holding device, to the controller, or to further components of the laser system 11 is made possible instead of mechanical connections. In this case, the optical element 23 can be provided with a transponder, that is, an IC memory element and an antenna, which enables a contactless transmission of the measurement data by means of RFID technology. Such a transponder can be provided in or on the carrier substrate 40, the carrier material 41, or the coating 32.

The abovementioned exemplary embodiments having diodes as temperature-sensitive elements 39 can have different characteristics in order to record the temperature of the laser beam 14. Such characteristics can have, for example, a forward or reverse voltage drop in the case of a known or constant current or a forward or reverse current in the case of a known or constant voltage applied to the temperature-sensitive elements 39.

The temperature dependencies can be recorded by means of these characteristics. The voltage difference is directly proportional to the temperature of the pixel, and thus the voltage difference can be derived from the recorded temperature dependencies. Consequently, direct conclusions can be drawn about the beam parameters depending on the laser 14 acting on the optical element 23.

The temperature sensor 38 integrated or embedded in the carrier substrate 40 and also its configuration from temperature elements 39 arranged in the form of rows and columns make it possible for a plurality of parameters to be able to be simultaneously recorded and evaluated. These include the beam power, for example. The beam power or the changes in the beam power can be recorded by means of the proportional change in the voltage depending on the temperature distribution. The output power of a laser beam 14 generated by the laser apparatus 13 can be known in this case. Consequently, along a beam path, for example, it is possible to record an alteration of the beam power by means of a comparison of the recorded data at a plurality of measurement locations (provided by a plurality of optical elements 23 along the beam path). Furthermore, the beam position and the deviation thereof can be recorded by means of the plurality of temperature-sensitive elements 39 within the optical elements 23. Consequently, it is possible to record conclusions about misalignments or incorrect alignments or alterations in the position of the optical elements 23 in the beam path. Beam profiles can furthermore be determined. On account of the direct dependence of the voltage on the temperature, beam profiles can be recorded by means of the pixel resolution.

The remote diagnosis or telediagnosis can furthermore be modified to the effect that, remote from the laser system 11, a comparison of the actual and desired values of the parameters, such as, for example, beam position, power, beam profile, is effected and a correction of the actual values or an approximation to desired values is effected externally. Such a remote control enables a plurality of laser systems 11 to be monitored and controlled from a central workstation.

The information about the actual parameters from the optical elements 23 is forwarded to the evaluation unit 30. The evaluation unit 30 can be integrated in the laser apparatus 13, can be arranged on the laser apparatus 13, or can be remote from the laser apparatus 13 and be connected to the external optical unit 18. The evaluation unit 30 can output the recorded data via a data line, via radio, or the like, such that a remote diagnosis or telediagnosis is made possible. Furthermore, the interrogation of the present parameters of a laser beam 14 that is made possible at any time has the advantage that an interruption of the work process is not required and a complete monitoring of the laser system 11 during operation is made possible. As a result of the recording of the temperature distribution in the optical element 23, a beam profile can be determined by means of the deconvolution method. Furthermore, the beam profile can be determined from the temperature distribution by applying the maximum entropy method.

By comparing the recorded values with the total power, it is also possible to identify incipient contamination, aging, or damage of the optical elements 23. At the same time, a so-called mode shot can be dispensed with as a result of this recording of the data. The required data can be determined by means of the temperature sensor 38 integrated in the optical element 23. Consequently, a time-consuming shutdown of the laser system 11 and also a complicated coupling-out of a laser beam 14 are not required. Moreover, a remote diagnosis, remote servicing, and remote control of laser systems can be made possible.

OTHER EMBODIMENTS

A number of embodiments of the invention have been described. Nevertheless, it will be understood that various modifications may be made. Accordingly, other embodiments are within the scope of the following claims.

The invention claimed is:

1. An optical element for guiding and shaping a laser beam, comprising:
   a carrier substrate comprising silicon;
   a coating that is applied to at least one side of the carrier substrate and that has a reflectance of radiation of at least 98%; and
   at least one temperature sensor that comprises a plurality of pixels arranged in a matrix, where each pixel comprises at least one temperature-sensitive element that is constructed in the carrier substrate.

2. The optical element of claim 1, wherein the at least one temperature-sensitive element is in the carrier substrate, the carrier substrate being made of silicon wafer.

3. The optical element of claim 1, wherein the temperature-sensitive elements are provided in p- or n-doped depressions or wells.

4. The optical element of claim 1, further comprising insulating sections that thermally insulate the temperature-sensitive elements from one another.

5. The optical element of claim 1, wherein a plurality of temperature-sensitive elements are connected in series in a pixel.

6. The optical element of claim 1, wherein a plurality of temperature-sensitive elements are connected in parallel in a pixel.

7. The optical element of claim 1, further comprising:
   the coating at a side of the carrier substrate that faces the temperature sensor, and
   a carrier material on a side of the carrier substrate is remote from the temperature sensor.

8. The optical element of claim 1, further comprising:
   a carrier material at a side of the carrier substrate that is remote from the temperature sensor, and
   the coating on an opposite side of the carrier material.

9. The optical element of claim 7, wherein the carrier material has a transmittance of at least 97% for the laser beam.

10. The optical element of claim 1, further comprising a passivation layer between the carrier substrate receiving the temperature-sensitive elements and the coating at the carrier substrate.

11. The optical element of claim 7, further comprising a stress-compensating layer on a side of the carrier material or on a side of the carrier substrate that is remote from the coating.

12. The optical element of claim 1 further comprising at least one multiplexer constructed adjacent to the matrix including pixels in the carrier substrate.

13. A method for recording and monitoring beam parameters of a laser beam in a laser system including one or more optical elements, where each optical element comprises a carrier substrate, a coating applied to at least one side of the carrier substrate, and at least one temperature sensor that includes a plurality of pixels arranged in a matrix and each pixel includes at least one temperature-sensitive element that is constructed in the carrier substrate, the method comprising:

recording data produced by one or more optical elements including recording data of individual pixels;

forwarding the data recorded by the one or more optical elements to an evaluation unit of the laser system; and comparing, using the evaluation unit, the forwarded data to desired stored values.

14. The method of claim 13, further comprising outputting the recorded data from the evaluation unit including transmitting the data to a remote central recording location.

15. The method of claim 14, wherein the beam parameters of the laser system are set and monitored by the central recording location.

16. The optical element of claim 1, wherein the at least one temperature-sensitive element comprises a diode.

17. The optical element of claim 1, further comprising an absorber layer at the carrier substrate receiving the temperature-sensitive elements.

18. The optical element of claim 1, further comprising electronic circuits embedded in the carrier substrate.

19. The optical element of claim 1, wherein at least a portion of the temperature sensor is configured to be in the path of the laser beam so that the laser beam impinges upon a plurality of the temperature-sensitive elements.

20. The method of claim 13, wherein the at least one temperature-sensitive element of the pixel is constructed in a carrier substrate comprising silicon, and the coating has a reflectance of the radiation of at least 98%.

21. The method of claim 14, wherein the remote central recording location is separated from the laser system.

22. The method of claim 13, wherein the recording and forwarding occurs while the laser system is in operation and without having to shut down the laser system.

23. A laser system comprising:

a laser apparatus that produces a laser beam; and one or more optical elements placed in the path of the laser beam, each optical element comprising:

a carrier substrate comprising silicon;

a coating that is applied to at least one side of the carrier substrate and that has a reflectance of at least 98%; and at least one temperature sensor that includes a plurality of pixels arranged in a matrix, where each pixel includes at least one temperature-sensitive element that is constructed in the carrier substrate.

24. The laser system of claim 23, wherein the at least one temperature-sensitive element is in the carrier substrate, the carrier substrate being made of silicon wafer.

25. The laser system of claim 23, wherein at least a portion of the temperature sensor is configured to be in the path of the laser beam so that the laser beam impinges upon a plurality of the temperature-sensitive elements.

26. The optical element of claim 8, wherein the carrier material has a transmittance of at least 97% for the laser beam.

* * * * *

UNITED STATES PATENT AND TRADEMARK OFFICE
CERTIFICATE OF CORRECTION

PATENT NO. : 8,591,105 B2  
APPLICATION NO. : 11/910120  
DATED : November 26, 2013  
INVENTOR(S) : Juergen-Michael Weick et al.

It is certified that error appears in the above-identified patent and that said Letters Patent is hereby corrected as shown below:

On the Title Page, Item (75) (Inventors), delete "Korntal-Muechingen" and insert
--Korntal-Muenchingen--.

Signed and Sealed this
Sixth Day of May, 2014

Michelle K. Lee
*Deputy Director of the United States Patent and Trademark Office*